United States Patent [19]
Tamarkin et al.

[11] Patent Number: 6,022,466
[45] Date of Patent: Feb. 8, 2000

[54] PROCESS OF PLATING SELECTIVE AREAS ON A PRINTED CIRCUIT BOARD

[75] Inventors: Vladimir K. Tamarkin, Huntingdon Valley; Frank J. Campisi, Philadelphia, both of Pa.

[73] Assignee: Unisys Corporation, Blue Bell, Pa.

[21] Appl. No.: 09/119,443

[22] Filed: Jul. 20, 1998

[51] Int. Cl.[7] .................................... C25D 5/02
[52] U.S. Cl. ..................... 205/126; 205/125; 205/920
[58] Field of Search .................................. 205/122, 125, 205/126, 920, 123; 427/96–98

[56] References Cited

U.S. PATENT DOCUMENTS

| | | | |
|---|---|---|---|
| 4,024,631 | 5/1977 | Castillero | 29/625 |
| 4,325,780 | 4/1982 | Schultz, Sr. | 156/659 |
| 4,394,223 | 7/1983 | Hall | 204/15 |
| 4,444,619 | 4/1984 | O'Hara | 156/645 |
| 5,169,692 | 12/1992 | Couble et al. | 427/436 |
| 5,733,466 | 3/1998 | Benebo et al. | 216/13 |
| 5,747,098 | 5/1998 | Larson | 427/58 |

*Primary Examiner*—Kathryn Gorgos
*Assistant Examiner*—J Brown
*Attorney, Agent, or Firm*—Steven B. Samuels; Mark T. Starr; Ratner & Prestia

[57] ABSTRACT

A process for plating gold on a multi-layered printed circuit board, having plated copper on an external surface. In one embodiment, first copper features for plating gold thereon and second copper features for plating copper thereon are selected on the external surface. The first copper features are internally connected to the second copper features. An etch-resist on the first and second copper features is deposited. The second copper features are masked, while a region containing the first copper features is exposed. Copper from the region is etched. The etch-resist on the first copper features is removed. Gold is then plated on the first copper features.

16 Claims, 4 Drawing Sheets

PROCESS OF PLATING SELECTIVE AREAS ON A PRINTED CIRCUIT BOARD

TECHNICAL FIELD

The present invention relates, in general, to the process of plating a noble metal on a printed circuit board and, more specifically, to a process for depositing gold on selected areas of a printed circuit board.

BACKGROUND OF THE INVENTION

When a printed circuit (PC) board has selective areas intended to have gold on them, the manufacturer may face significant challenges with its gold plating processes. In most cases, features requiring gold finish are first attached to plating rails, as shown by way of example in FIG. 1. PC board 10 has surface copper features, such as fingers 14a–14d, which are to be finished with gold; it also has surface copper features, such as tabs 12a–12c, which are to be finished with gold, as well. In a standard process, connecting busses 20a–20e must be patterned as additional surface copper features on PC board 10 and plating rail 18 is connected to them. Extraneous copper is then etched away, leaving behind all the copper features shown in FIG. 1, namely tabs 12a–c, fingers 14a–d, busses 20a–e and plating rail 18. PC board 10 is then placed in an electroplating bath containing gold. Plating rail 18 is then electrically charged at a negative potential, whereas the bath is electrically charged at a positive potential. Since all the copper features on PC board 10 are electrically connected to plating rail 18, gold is deposited, or coated, on all the copper features. The plating rail and the busses are then removed by mechanical means, such as cutting or routing off the board. In this manner, good quality gold finish is produced on the PC board.

The above described process may not be used, however, when a plating rail or its associated busses cannot be patterned on the PC board. In this case, the PC board manufacturer has two options: (1) electroplate gold before etching copper, or (2) use electroless plating to deposit gold after the extraneous copper has been etched away. Each of these options will now be described with reference to FIGS. 2 and 3.

Multilayer circuits normally consist of two or more layers of separate and different circuit patterns which have been laminated together under heat and pressure to produce a strong multilayer PC board. FIG. 2 shows a small cross section of PC board 10 illustrating sheets 22a–22d having been pressed together to form a multi-layered board. Inner layers 26b–26d and outer layers 26a and 26e (laminas 26a and 26e) may each contain voltage and ground planes, as well as mounted integrated circuits (not shown) where the planes provide the power connections. Ground and voltage planes of identical configuration may often be employed in several boards having different circuitry patterned to suit the operational requirement of the user. Some boards may contain inner layers composed of circuit patterns with numerous conductors; other boards may contain both circuit patterns and planes as inner layers. The latter are being found increasingly useful in high density packaging that employs integrated circuits.

In order to connect the layers in a multi-layer board, plated-through holes are made. As shown in FIG. 2, through holes 24a and 24b have been drilled in PC board 10. Through a process explained below, the through holes are plated with a metal, such as copper, to form conductor layers 30a and 30b. In this manner, pads 28a and 28b, for example, may be interconnected.

Returning now to option 1, the typical process for electroplating gold before etching copper will be described by referring to FIGS. 3a and 3b. As shown, PC board 10, which has multiple sheets (only sheets 22a and 22b shown), is laminated under heat and pressure to form a multi-layered board. Through holes (only through hole 24a shown) are drilled and cleaned. The following steps are performed next:

a) Electroless copper is deposited to form first copper layer 42. It will be appreciated that copper layer 42 is deposited everywhere, e.g. on top of lamina 26a, on the bottom lamina (not shown), and in all the through holes (only through hole 24a shown).

b) Mask 40 is patterned to protect areas from the subsequent depositions of copper and solder.

c) Second copper layer 44 is electroplated on all areas not protected by mask 40. It will be appreciated that second copper layer 44 forms the pads and busses on lamina 26a and on the bottom lamina (not shown). It will further be appreciated that second copper layer 44 may be electroplated, because of the presence of first copper layer 42. Since first copper layer 42 is formed continuously everywhere on the top and bottom of PC board 10, a plating rail may be formed, as described earlier, thus permitting electroplating.

d) Solder is electroplated next to form etch-resist layer 46. It will be appreciated that tin-lead may also be used as an etch-resist.

e) Next, mask 40 is removed in a standard manner.

f) New mask 50 is patterned prior to gold depositions for protecting areas from the subsequent deposition of gold.

g) Etch-resist layer 46 is stripped from all areas not protected by new mask 50.

h) Gold is electroplated on all areas that previously were stripped. Sometimes a layer of nickel is deposited first and then the gold is deposited on top of the nickel. Although not shown in FIG. 3b, it will be appreciated that a gold layer replaces etch-resist layer 46 in areas external to new mask 50.

i) New mask 50 is now removed (not shown).

j) Finally, copper is etched from the board (not shown). All areas on the board that still have etch-resist layer 46 are protected from copper being etched away. In addition, areas having had gold deposited on them are also protected, because the gold layer also acts as an etch-resist.

In this manner, gold may be electroplated prior to etching of copper, because all features on the board are still electrically connected. In this case, during a subsequent etching process, the gold serves as an etch-resist in selected areas, while solder or tin-lead serves as an etch-resist on the rest of the board.

Problems arise, however, with the process just described. While gold and solder (or tin-lead) serve as an etch-resist during copper etching, some amount of copper is etched from under the gold and solder layers. This is known as an under-cut phenomenon. While under-cutting is not a problem with a solder layer, because the solder may subsequently be re-flowed, it is a major quality issue with a gold layer. Since the gold cannot be re-flowed, a thin layer of gold may overhang the copper base, and may easily break-off and contaminate the board with conductive gold flakes.

In order to avoid the aforementioned problem, PC board manufacturers may sometimes select another process which uses electroless plating to deposit gold, after the extraneous copper has been etched away. This process does not require an electrical path between surface copper features to be plated and produces a good quality of gold finish, without any gold overhang. The gold electroless plating chemistry, however, is very aggressive and there are no production-quality resists (mask patterning) available to adequately protect copper features, which must remain unplated from being gold plated.

Furthermore, if gold is deposited on copper features that subsequently are exposed to soldering (during component assembly, for example), solder joint quality and reliability are affected. This effect is proportional to the amount of deposited gold. In cases where the amount of gold required is minimal (less than 15 micro-inches), PC board manufacturers may choose to deposit gold everywhere on the board. Solderability may still be affected, but the need to mask off areas on the PC board is eliminated. If the amount of gold required in selected areas exceeds the amount that may be allowable, however, the board must be masked off and this process quickly falls apart due to unavailability of masks.

The deficiencies of the conventional processes to selectively plate gold on surface copper features of a PC board show that a need still exists for a process which can selectively deposit gold on surface copper features after surface etching, thereby avoiding problems with undercutting, gold overhangs and flake-offs.

SUMMARY OF THE INVENTION

To meet this and other needs, and in view of its purposes, the present invention provides a process for plating gold on a multi-layered printed circuit board, having plated copper on an external surface. One embodiment, includes the following steps:

a) First copper features for plating gold thereon and second copper features for plating copper thereon are selected on the external surface.

b) The first copper features are internally connected to the second copper features.

c) An etch-resist is deposited on the first and second copper features.

d) The second copper features are masked, while a region containing the first copper features are exposed.

e) Copper is etched from the region.

f) The etch-resist on the first copper features is removed.

g) Gold is plated on the first copper features.

The process also includes removing the mask after plating gold; etching exposed copper after removing the mask; and removing the etch-resist on the second copper features.

It is understood that the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

Figure 1:
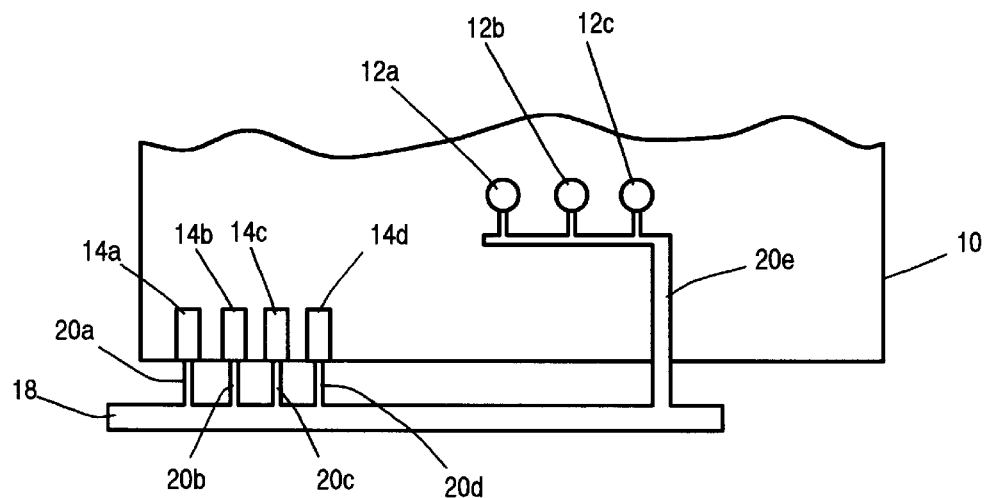
FIG. 1 is a plan view of a PC board showing gold features attached to a plating rail in a conventional process.
Figure 2:
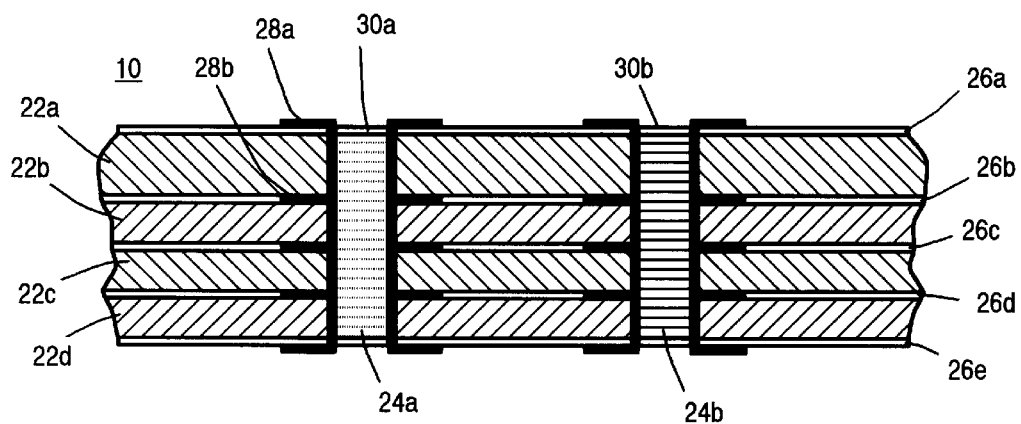
FIG. 2 is a cross-section of a multi-layered PC board showing copper plated-through holes made in a conventional process.
Figure 3A:
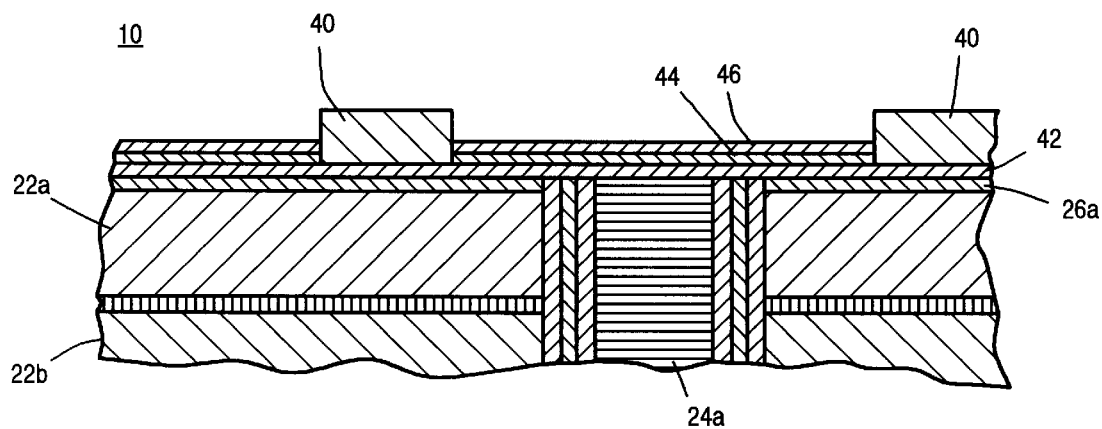
FIGS. 3a and 3b are cross-sections of a multi-layered PC board during different steps of electroplating gold in a conventional process.
Figure 3B:
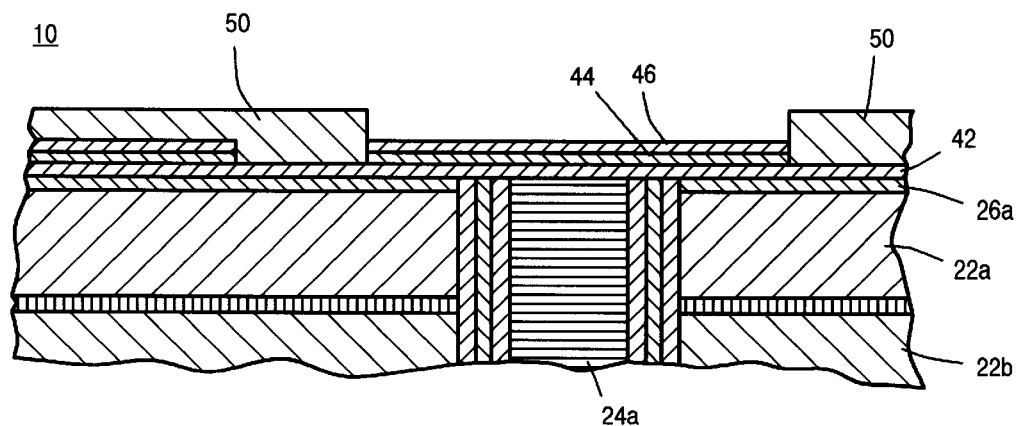
Figure 4A:
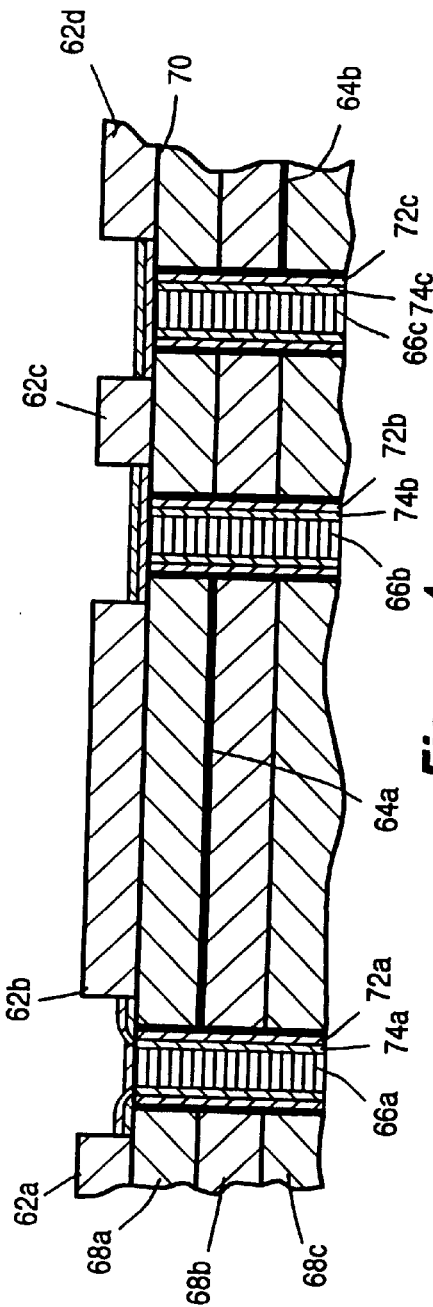
FIGS. 4a–4c are cross-sections of a multi-layered PC board during different process steps of electroplating gold according to one embodiment of the invention.

Referring to FIGS. 4a–4c and FIG. 5 the invention will now be described, with like numerals denoting similar elements. PC board 60 is a multi-layered board, wherein only upper three copper clad laminas 68a, 68b, and 68c are shown in FIG. 4a. Through holes 66a–c are shown drilled in PC board 60; electroless copper layer 70 is shown deposited on top of copper clad lamina 68a and on the walls of through holes 66a–c. The bottom of the lower copper clad lamina (not shown) is also coated with electroless copper layer 70.

To better understand the invention plated-through holes 66b and 66c are to be coated with gold, but plated-through hole 66a is to have unplated copper only (i.e., is not to be finished with gold). According to the present invention, conductor 64a must first be added between through hole 66b, which is to be plated with gold, and through hole 66a, which is to be unplated copper only. It will be understood that conductor 64a may be formed in a conventional manner prior to lamination of multi-layered board 60. It will further be appreciated that according to the present invention all surface features, which are to be gold finished, must be electrically connected (internally) to plated-through holes which are outside the gold-finished areas. Hence, conductor 64b must similarly be formed between through hole 66c and another through hole (not shown) which is to remain as unplated copper.

Figure 4B:
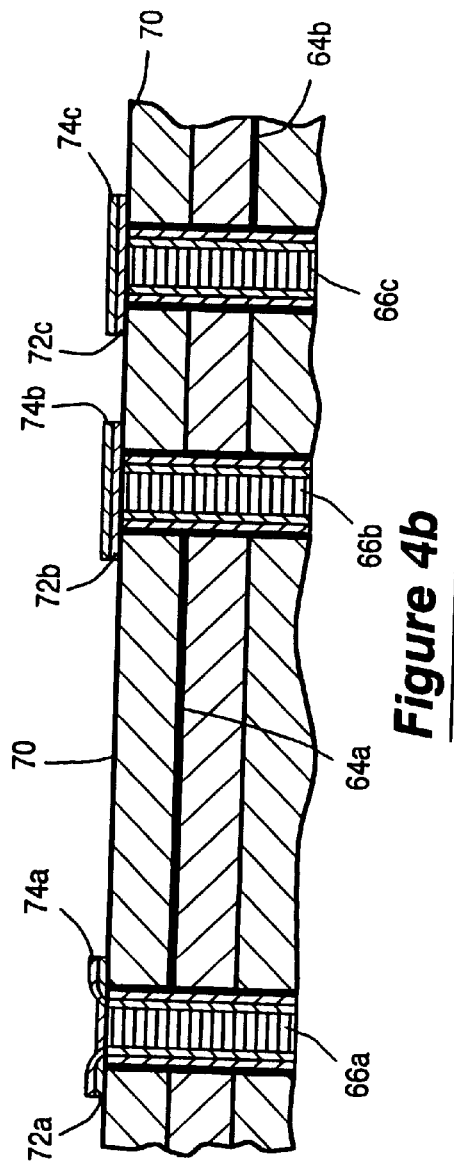
Figure 4C:
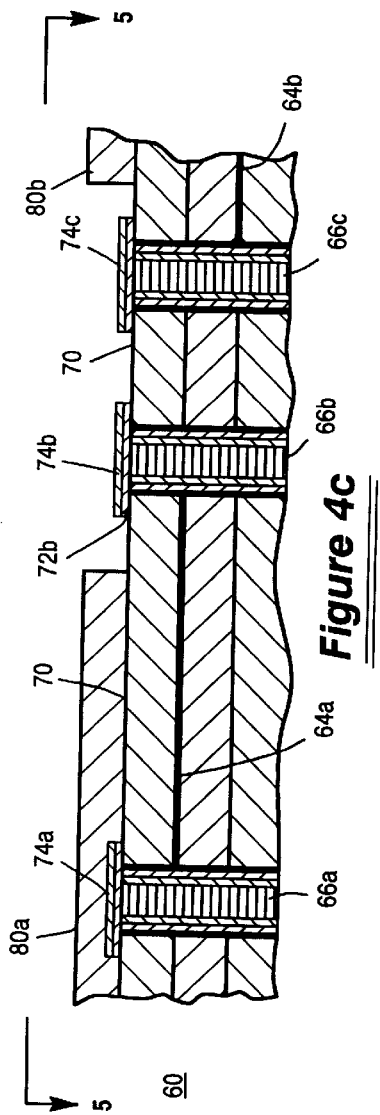
Figure 5:
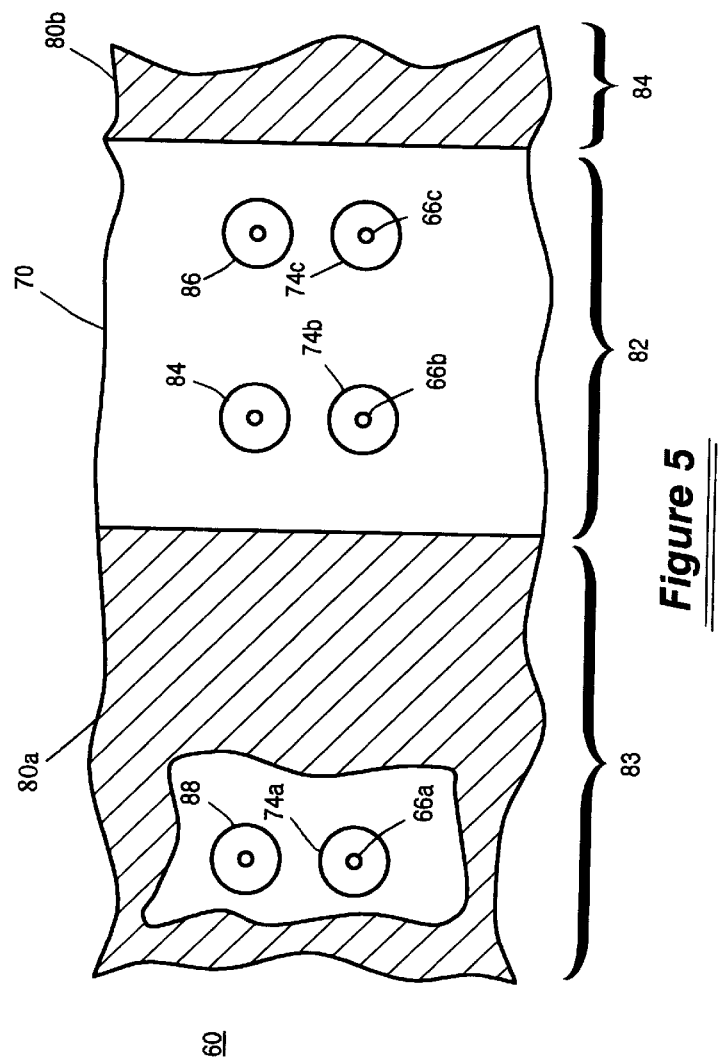
FIG. 5 is a plan view of the multi-layered PC board taken along section 5—5 of FIG. 4c with a portion of mask 80a having been removed.

After multi-layered PC board 60 is designed to include conductors internally connected between features, which require gold finishes, and plated-through holes, which require to remain as unplated copper, the present invention includes the steps described below. These steps should preferably be performed in the sequence shown. According to the present invention, steps (a) through (e) may be performed in a conventional manner, as follows:

a) Electroless copper is deposited in a conventional manner to form a first copper layer 70 on the PC board's top and bottom surfaces and in all the through holes, as shown in FIG. 4a.

b) Masks 62a–d are patterned by applying and developing resist in a conventional manner to form the pattern of surface circuitry.

c) Second copper layers 72a–c are electroplated in a conventional manner on all areas not protected by the resist masks. Thus, copper is plated into through holes 66a–c to provide electrical connections between layers and to plate-up circuitry patterns. It will be appreciated that steps (b) and (c) described what is known as a pattern-plating process. For a panel-plating process, steps (b) and (c) are reversed.

d) Solder or tin-lead is plated next to form etch-resist layers 74a–c on top of second copper layers 72a–c, respectively. This step is performed in a conventional manner.

e) Masks 62a–d are removed in a conventional manner, thus leaving the features (circular tabs) shown in FIG. 4b and FIG. 5. It will be appreciated that the features could be of any shape, but are shown as circular tabs for exemplary purposes.

Next, steps (f) through (i) are performed according to the present invention, as follows:

f) A new mask is patterned to mask all areas of the PC board which do not require gold finishes. Therefore, referring to FIG. 4c and FIG. 5, non-gold-area-masks 80a–b are applied and developed as resists on the external surfaces of PC board 60. Thus, non-masked area 82, shown in FIG. 5, is not masked.

g) Copper layer 70 is then etched from the surface of non-masked region 82. It will be appreciated that circular tabs 74b, 74c, 84 and 86 are protected from the etching of copper, because of the solder (or tin-lead) residing on these circular tabs being an etch-resist to copper etching.

h) After extraneous copper has been removed from non-masked region 82, the solder (or tin-lead) on the circular tabs (layers 74b and 74c in FIG. 4c; layers 74b, 74c, 84 and 86 in FIG. 5) is stripped.

i) Next, gold is electroplated on the circular tabs. This step is possible because all copper features within gold area have been internally connected to un-etched copper outside of the gold areas. For example, copper feature 72b is electrically connected to plated-through hole 66a, which in turn is connected to un-etched copper layer 70, shown in FIG. 4c. It will be appreciated that gold is deposited on all exposed copper including the side-walls of the copper features.

Finally, steps (j) through (l) may be formed in a conventional manner, as follows:

j) Masks 80a–b are removed in a conventional manner, thus leaving the features (circular tabs) shown in FIG. 5. The features shown in region 83 still have solder (or tin-lead) layers 88 and 74a on tops forming a resist to etching of copper; the features shown in region 82 now have gold on top, also forming a resist to etching of copper.

k) Copper layer 70 is now etched in regions 83 and 84. Previously plated solder (or tin-lead) protects surface features outside the gold areas.

l) The plated solder (or tin-lead), shown as solder layers 74a and 88 in FIG. 5, may be stripped away in a conventional manner, if the PC board requires SMOBC (solder mask over bare copper) finish. If a SMOBC finish is not required, then the plated solder is re-flowed. Finally, if required, a solder mask may be applied and a protective ESP coating for the solderable surfaces may also be applied. Both may be done in a conventional manner.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. It will be understood, for example, that the present invention is not limited to only gold features. Rather, the invention may be extended to other noble metals beyond gold, such as silver, and palladium.

It will further be understood that the present invention may be extended to a process for plating any noble metal on a semiconductor device having multiple layers.

What is claimed is:

1. A process for plating gold on a multi-layered printed circuit board, having plated copper on an external surface, comprising the steps of:

a) selecting on the external surface first copper features for plating gold thereon and second copper features for plating copper thereon;

b) internally connecting the first copper features to the second copper features;

c) depositing an etch-resist on the first and second copper features;

d) masking the second copper features, and exposing a region containing the first copper features;

e) etching copper from the region;

f) removing the etch-resist on the first copper features, after etching the copper; and g) plating gold on the first copper features, after removing the etch-resist.

2. The process of claim 1 wherein step b) includes electrically connecting the first copper features and the second copper features by way of plated-through holes.

3. The process of claim 2 wherein steps (a)–(g) are performed in sequence.

4. The process of claim 3 wherein the etch-resist is one of solder and tin-lead.

5. The process of claim 4 wherein step g) includes the following additional steps:

h) removing the mask after plating gold;

i) etching exposed copper after removing the mask; and j) removing the etch-resist on the second copper features.

6. The process of claim 5 wherein the plated copper on the external surface is electrically connected to a plating rail, and the plating rail is removed after plating gold.

7. The process of claim 6 wherein the gold includes nickel as an additive.

8. A process for plating gold on a multi-layered semiconductor device, having plated copper on an external surface, comprising the steps of:

a) selecting on the external surface first copper features for plating gold thereon and second copper features for plating copper thereon;

b) internally connecting the first copper features to the second copper features;

c) depositing an etch-resist on the first and second copper features;

d) masking the second copper features, and exposing a region containing the first copper features;

e) etching copper from the region;

f) removing the etch-resist on the first copper features, after etching copper; and g) plating gold on the first copper features, after removing the etch-resist.

9. The process of claim 8 wherein step b) includes electrically connecting the first copper features and the second copper features by way of plated-through holes.

10. The process of claim 9 wherein the etch-resist is one of solder and tin-lead.

11. The process of claim 10 wherein step g) includes the following additional steps:

h) removing the mask after plating gold;

i) etching exposed copper after removing the mask; and j) removing the etch-resist on the second copper features.

12. The process of claim 11 wherein the plated copper on the external surface is electrically connected to a plating rail, and the plating rail is removed after plating gold.

13. The process of claim 12 wherein step g) includes plating nickel prior to plating gold.

14. A process for plating a noble metal on a multi-layered printed circuit board, having plated copper on an external surface, comprising the steps of:

a) selecting on the external surface first copper features for plating the noble metal thereon and second copper features for plating copper thereon;

b) internally connecting the first copper features to the second copper features;

c) depositing an etch-resist on the first and second copper features;

d) masking the second copper features, and exposing a region containing the first copper features;

e) etching copper from the region;

f) removing the etch-resist on the first copper features, after etching the copper;

g) plating the noble metal on the first copper features, after removing the etch-resist;

h) removing the mask after plating the noble metal;

i) etching exposed copper after removing the mask; and j) removing the etch-resist on the second copper features.

15. The process of claim 14 wherein step b) includes electrically connecting the first copper features and the second copper features by way of plated-through holes.

16. The process of claim 15 wherein the noble metal is one of gold, silver and palladium.

* * * * *